(12) United States Patent
Shih

(10) Patent No.: US 11,937,402 B2
(45) Date of Patent: Mar. 19, 2024

(54) HEAT DISSIPATION DEVICE AND GRAPHICS CARD ASSEMBLY

(71) Applicant: COOLER MASTER CO., LTD., Taipei (TW)

(72) Inventor: Shun-Yu Shih, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 145 days.

(21) Appl. No.: 17/585,008

(22) Filed: Jan. 26, 2022

(65) Prior Publication Data

US 2023/0189425 A1 Jun. 15, 2023

(30) Foreign Application Priority Data

Dec. 10, 2021 (TW) ................. 110146316

(51) Int. Cl.
*H05K 7/20* (2006.01)
*H05K 1/02* (2006.01)

(52) U.S. Cl.
CPC ....... *H05K 7/20336* (2013.01); *H05K 1/0203* (2013.01); *H05K 7/20145* (2013.01)

(58) Field of Classification Search
CPC ........... H05K 7/20145; H05K 7/20154; H05K 7/20336; H05K 7/2039; H05K 1/0203; H01L 23/3672; H01L 23/427; H01L 23/467; F28F 1/325; F28F 2215/08; F28F 2215/10; F28D 15/02
See application file for complete search history.

(56) References Cited

U.S. PATENT DOCUMENTS

| | | | | |
|---|---|---|---|---|
| 8,854,819 | B2* | 10/2014 | Chen | H01L 23/427 165/185 |
| 9,163,884 | B2* | 10/2015 | Hwang | H01L 23/3672 |
| 9,301,395 | B2* | 3/2016 | Liang | H01G 9/28 |
| 2010/0147493 | A1* | 6/2010 | Dai | H01L 23/427 165/104.26 |
| 2010/0282444 | A1* | 11/2010 | Lin | F28D 15/0275 165/185 |
| 2014/0116659 | A1* | 5/2014 | Lin | F28F 1/32 165/121 |
| 2022/0136784 | A1* | 5/2022 | Lin | H01L 23/427 165/80.1 |

FOREIGN PATENT DOCUMENTS

JP        3176492 U  *  6/2012  ............. G06F 1/183

* cited by examiner

*Primary Examiner* — Zachary Pape
*Assistant Examiner* — Steven Ngo
(74) *Attorney, Agent, or Firm* — Maschoff Brennan

(57) ABSTRACT

A heat dissipation device includes a plurality of fins, at least one first heat pipe and at least one second heat pipe. Each of the fins includes a main body and two first deflectors. The main body has an inflow side, an outflow side and two first communication openings. The first communication openings are located between the inflow side and the outflow side. The first deflectors are arranged obliquely relative to the main body and respectively located on sides of the first communication openings. Air flowing out of the first communication openings is guided by the first deflectors to flow into an area between the first deflectors. The first heat pipe is located between the first deflectors. The second heat pipe is located on one side of one of the first deflectors located relatively far away from the other one of the first deflectors.

32 Claims, 4 Drawing Sheets

HEAT DISSIPATION DEVICE AND GRAPHICS CARD ASSEMBLY

CROSS-REFERENCE TO RELATED APPLICATIONS

This non-provisional application claims priority under 35 U.S.C. § 119(a) on Patent Application No(s). 110146316 filed in Taiwan, R.O.C. on Dec. 10, 2021, the entire contents of which are hereby incorporated by reference.

TECHNICAL FIELD

This disclosure relates to a heat dissipation device and a graphics card assembly, more particularly to a heat dissipation device having a deflector and a graphics card assembly including the same.

BACKGROUND

Nowadays, it is an era of information explosion, and electronic products have become inseparable from daily life. With the development of technology, electronic products have been innovated as well, and thus, the generated heat therefrom is also increasing. Therefore, the heat generated by heat sources needs to be effectively dissipated to outside by a heat dissipation device so as to ensure portable electronic devices having the heat sources can function normally. Fans are one of various heat dissipation devices that are commonly used. Hot air near the heat sources can be blown or drawn away by the fans, such that the heat generated by the heat sources may be brought away by the air nearby, thereby dissipating heat.

For example, in general, the manufacturers may provide a GPU having heat dissipation fins thereon with a fan disposed on the fins. The heat dissipation fins are configured to absorb heat generated by the GPU, and the fan is configured to generate a cooling airflow to bring the heat accumulated in the fins away.

However, not only the GPU but also other electronic components, such as capacitors and resistors, adjacent to the GPU are required to be cooled. Therefore, it is difficult for conventional heat dissipation fins to simultaneously meet the heat dissipation requirements for the GPU and the electronic components around the GPU.

SUMMARY

The present disclosure is to provide a heat dissipation device and a graphics card assembly capable of simultaneously meeting the heat dissipation requirements for a heat source and electronic components around the heat source.

One embodiment of the disclosure provides a heat dissipation device including a plurality of fins, at least one first heat pipe and at least one second heat pipe. Each of the fins includes a main body and two first deflectors. The main body has an inflow side, an outflow side and two first communication openings located between the inflow side and the outflow side. The two first deflectors are arranged obliquely relative to the main body and respectively located on sides of the two first communication openings. Air flowing out of the two first communication openings is guided by the two first deflectors to flow into an area between the two first deflectors. The first heat pipe is located between the first deflectors. The second heat pipe is located on one side of one of the two first deflectors located relatively far away from the other one of the two first deflectors.

One embodiment of the disclosure provides a heat dissipation device a plurality of fins, at least one first heat pipe and at least one second heat pipe. Each of the fins includes a main body, a first deflectors and second deflector. The main body has an inflow side, an outflow side, a first communication opening and a second communication opening. The first communication opening and the second communication opening are located between the inflow side and the outflow side. The first deflector and the second deflector are arranged obliquely relative to the main body. The first deflector is located on one side of the first communication opening. The second deflector is located on one side of the second communication opening. Air flowing out of the first communication opening is guided by the first deflector to flow towards one side of the first deflector located away from the second deflector, and air flowing out of the second communication opening is guided by the second deflector to flow towards one side of the second deflector located relatively far away from the first deflector. The first heat pipe is located at one side of the first deflector located relatively far away from the second deflector. The second heat pipe is located between the first deflector and the second deflector.

One embodiment of the disclosure provides a graphics card assembly includes a graphics card body and a heat dissipation device. The heat dissipation device is disposed on the graphics card body. The heat dissipation device includes a plurality of fins, at least one first heat pipe and at least one second heat pipe. Each of the fins includes a main body and two first deflectors. The main body has an inflow side, an outflow side, a first communication opening and a second communication opening. The first communication opening and the second communication opening are located between the inflow side and the outflow side. The first deflector and the second deflector are arranged obliquely relative to the main body. The first deflector is located on one side of the first communication opening. The second deflector is located on one side of the second communication opening. Air flowing out of the first communication opening is guided by the first deflector to flow towards one side of the first deflector located relatively far away from the second deflector, and air flowing out of the second communication opening is guided by the second deflector to flow towards one side of the second deflector located relatively far away from the first deflector. The first heat pipe is located on one side of the first deflector located relatively far away from the second deflector. The second heat pipe is located between the first deflector and the second deflector.

According to the heat dissipation device and the graphics card assembly as described above, by the design of the first deflector and the second deflector, airflow may be directly guided by the communication opening and the deflector to flow directly towards the heat pipes, or only guided by the deflector to flow towards the heat pipes. Accordingly, the heat dissipation device not only can cool the heat pipes having higher temperature, but also can meet the heat dissipation requirements of the heat source and the electronic components around the heat source located adjacent to the outflow side.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
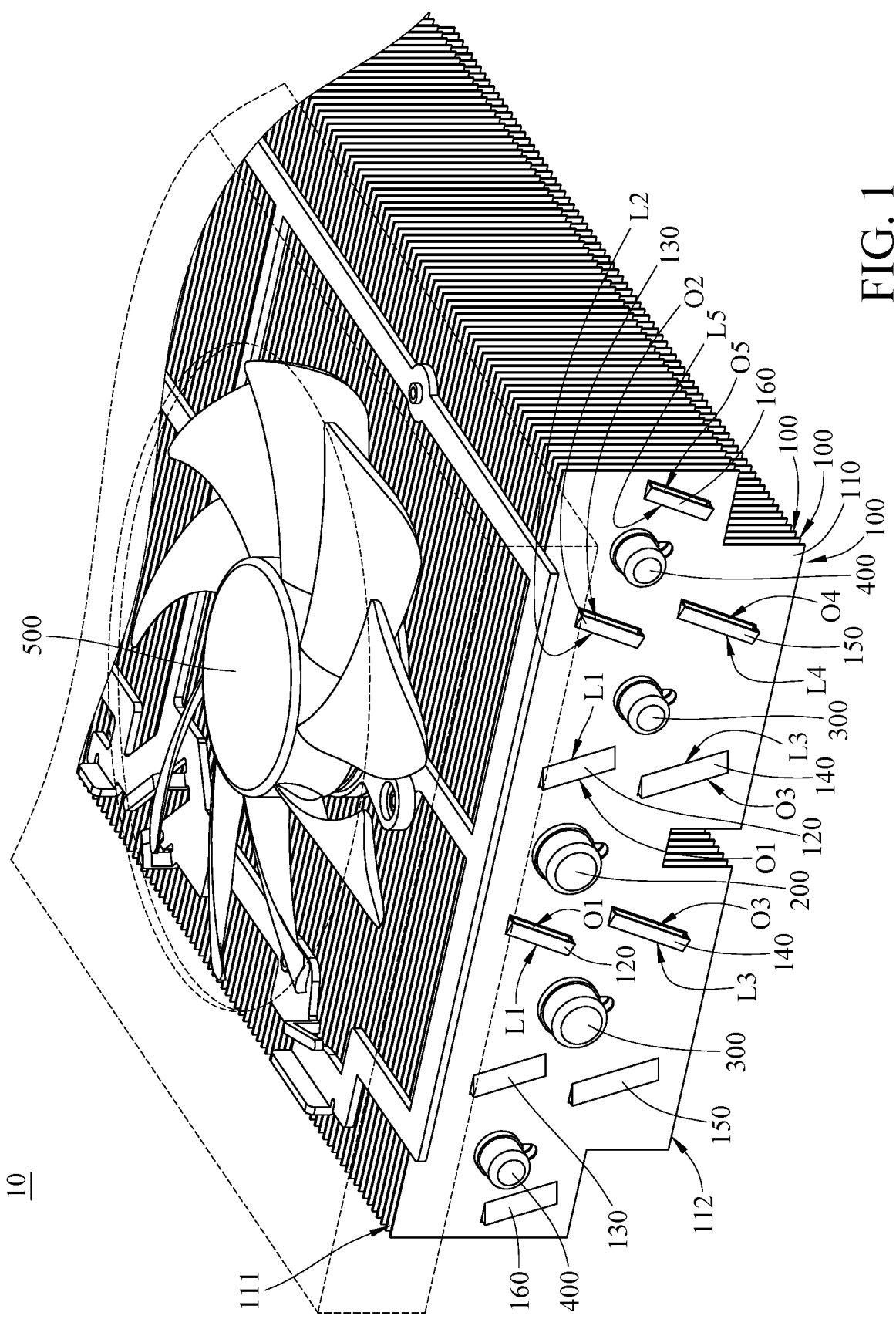
FIG. 1 is a partial perspective view of a heat dissipation device in accordance with one embodiment of the disclosure.
Figure 2:
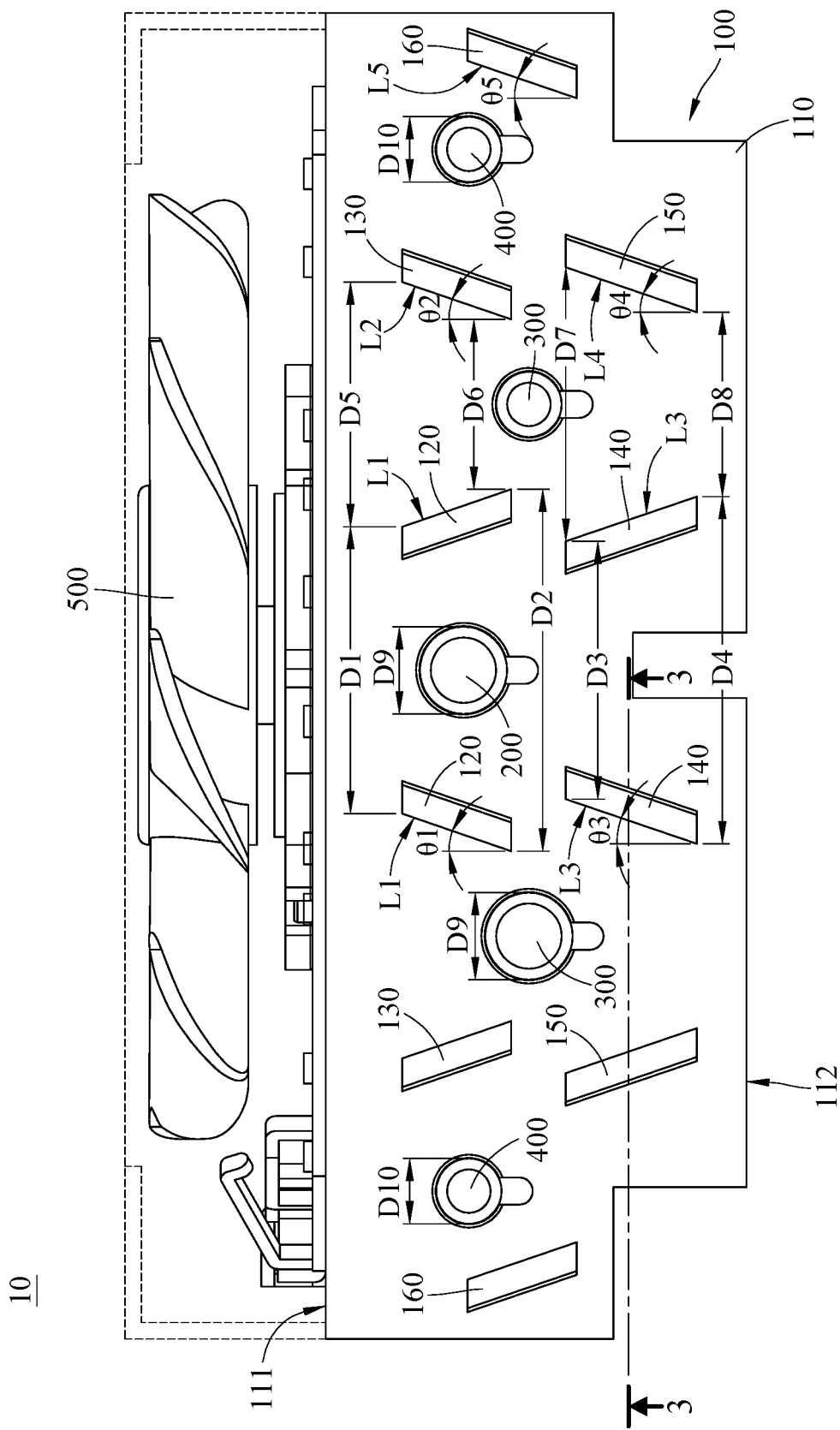
FIG. 2 is a side view of the heat dissipation device in FIG. 1.
Figure 3:
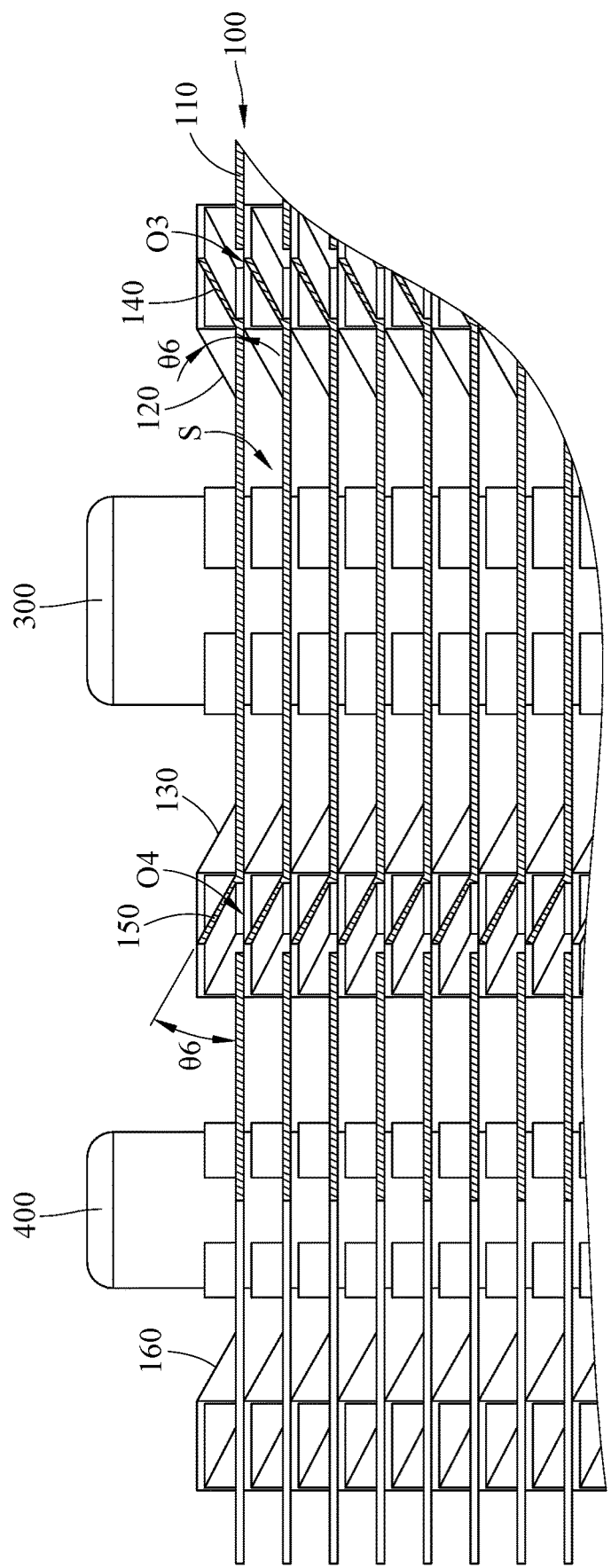
FIG. 3 is a partial cross-sectional view sectioned along line 3-3 in FIG. 2.
Figure 4:
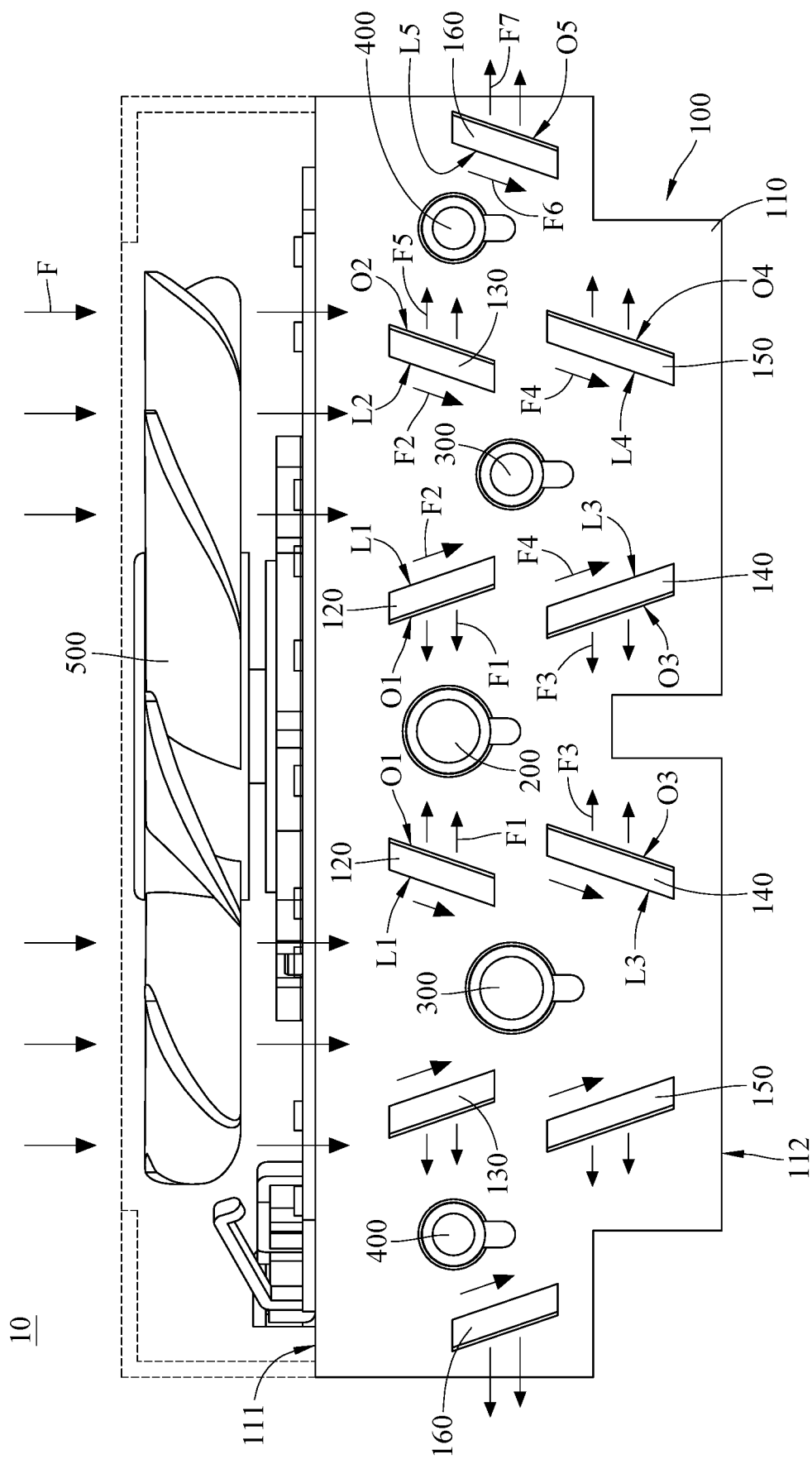
FIG. 4 is a schematic view of the heat dissipation device in FIG. 2 showing airflows.

Please refer to FIG. 1 to FIG. 4. FIG. 1 is a partial perspective view of a heat dissipation device 10 in accordance with one embodiment of the disclosure. FIG. 2 is a side view of the heat dissipation device 10 in FIG. 1. FIG. 3 is a partial cross-sectional view sectioned along line 3-3 in FIG. 2. FIG. 4 is a schematic view of the heat dissipation device 10 in FIG. 2 showing airflows.

In this embodiment, the heat dissipation device 10 includes a plurality of fins 100, a first heat pipe 200 and two second heat pipes 300. Each of the fins 100 includes a main body 110 and two first deflectors 120. These main bodies 110 are arranged spaced apart from one another, and a passage S is formed between two adjacent main bodies 110 among all of the main bodies 110. Each of the main bodies 110 has an inflow side 111, an outflow side 112 and two first communication openings O1. The two first communication openings O1 are connected to the passage S and located between the inflow side 111 and the outflow side 112. The two first deflectors 120 are arranged obliquely relative to the main body 110 and respectively located on one side of the two first communication openings O1, and air flowing out of the two first communication openings O1 can be guided by the two first deflectors 120 to flow towards an area between the two first deflectors 120. The first heat pipe 200 is located between the two first deflectors 120, and air flowing out of the two first communication openings O1 flows towards the first heat pipe 200. Each second heat pipe 300 is located at one side of one of the first deflectors 120 of the fin 100 which is located opposite to the other one of the first deflectors 120 of the fin 100; that is, one of the first deflectors 120 of the fin 100 is located between the other one of the first deflectors 120 of the fin 100 and the second heat pipe 300. Air flowing out of the two first communication openings O1 does not flow towards the second heat pipes 300.

In this and other embodiments, a distance between two long sides L1 of the two first deflectors 120 gradually increases in a direction from the inflow side 111 towards the outflow side 112. That is, a distance D1 between the two long sides L1 of the two first deflectors 120 at ends of these first deflectors 120 located closer to the inflow side 111 is smaller than a distance D2 between the two long sides L1 of the two first deflectors 120 at other ends thereof located farther away from the inflow side 111.

In this and other embodiments, each of the main bodies 110 may further have two second communication openings O2, and each of the fins 100 may further include two second deflectors 130. Since the two second communication openings O2 are arranged in reflection symmetry with respect to the two first deflectors 120, and the two second deflectors 130 are arranged in reflection symmetry with respect to the two first deflectors 120, only one of the second communication openings O2 and only one of the second deflectors 130 are described below.

The second communication opening O2 is connected to the passage S and located on one side of one of the two first deflectors 120 located relatively far away from the other one of the two first deflectors 120. The second deflector 130 is arranged obliquely relative to the main body 110 and located on one side of the second communication opening O2 located relatively close to the two first deflectors 120, and air flowing out of the second communication opening O2 is guided by the second deflector 130 to flow towards one side of the second deflector 130 located relatively far away from the two first deflectors 120.

Furthermore, a distance between a long side L2 of the second deflector 130 and the long side L1 of the adjacent first deflector 120 gradually decreases in the direction from the inflow side 111 towards the outflow side 112. That is, a distance D5 between the long side L2 of the second deflector 130 and the long side L1 of the adjacent first deflector 120 at ends thereof located closer to the inflow side 111 is larger than a distance D6 between the long side L2 of the second deflector 130 and the long side L1 of the adjacent first deflector 120 at other ends thereof located farther away from the inflow side 111. Therefore, the second deflector 130 and the first deflector 120 located adjacent to the second deflector 130 are configured to guide air from the inflow side 111 towards the outflow side 112 to flow towards the second heat pipe 300 and then leave from the outflow side 112. Accordingly, the first deflector 120 and the second deflector 130 adjacent to each other can guide air to cool the second heat pipe 300, and the air can also cool the heat source (e.g., a CPU, a resistor and a capacitor) located near the outflow side 112.

In this and other embodiments, each of the fins 100 may further include two third deflectors 140, and the main body 110 may further have two third communication openings O3. The two third communication openings O3 are connected to the passage S and located between the inflow side 111 and the outflow side 112. The two third communication openings O3 are located farther away from the inflow side 111 than the two first communication openings O1 to the inflow side 111. That is, the third communication openings O3 are located at the downstream side of the first communication openings O1. The two third deflectors 140 are arranged obliquely relative to the main body 110 and respectively located on one side of the two third communication openings O3, and air flowing out of the two third communication openings O3 is guided by the two third deflectors 140 to flow into an area between the two third deflectors 140.

In this and other embodiments, a distance between long sides L3 of the two third deflectors 140 gradually increases in the direction from the inflow side 111 towards the outflow side 112. That is, a distance D3 between the long sides L3 of the two third deflectors 140 at ends of these third deflectors 140 located closer to the inflow side 111 is smaller than a distance D4 between the long sides L3 of the two third deflectors 140 at other ends thereof located farther away from the inflow side 111.

In this and other embodiments, the maximum distance D2 between the long sides L1 of the two first deflectors 120 is larger than the maximum distance D4 between the long sides L3 of the two third deflectors 140, and the minimum distance D1 between the long sides L1 of the two first deflectors 120 is larger than the minimum distance D3 between long sides L3 of the two third deflectors 140. Accordingly, the heat dissipation performance of the heat dissipation device 10 can be improved by the airflow path formed by the two first deflectors 120 and the two third deflectors 140.

In this embodiment, there is no heat pipe provided between the two third deflectors 140, such that air flowing out of the two third communication openings O3 can directly turn and flow towards the heat source disposed on the outflow side 112, but the present disclosure is not limited thereto. In other embodiments, there may be an additional heat pipe (not shown) provided between two third deflectors, such that air flowing out of two third communication openings may cool this additional heat pipe.

In this and other embodiments, the main body 110 may further have two fourth communication openings O4, and each of the fins 100 may further include two fourth deflectors 150. Since the two fourth communication openings O4 are arranged in reflection symmetry with respect to the two third deflectors 140, and the two fourth deflectors 150 are arranged in reflection symmetry with respect to the two third deflectors 140, only one of the fourth communication openings O4 and only one of the fourth deflectors 150 are described below.

The fourth communication opening O4 is connected to the passage S and the fourth communication opening O4 is located farther away from the inflow side 111 than the second communication opening O2 to the inflow side 111. That is, the fourth communication opening O4 is located at the downstream side of the second communication opening O2. The fourth deflector 150 is arranged obliquely relative to the main body 110 and located on one side of the fourth communication opening O4 located relative close to the third deflector 140, and air flowing out of the fourth communication opening O4 is guided by the fourth deflector 150 to flow towards one side of the fourth deflector 150 located relatively far away from the two third deflectors 140.

Furthermore, a distance between a long side L4 of the fourth deflector 150 and the long side L3 of the third deflector 140 located closer to the fourth deflector 150 gradually decreases in the direction from the inflow side 111 towards the outflow side 112. That is, a distance D7 between the long side L3 of the third deflector 140 and the long side L4 of the adjacent fourth deflector 150 at ends thereof located closer to the inflow side 111 is larger than a distance D8 between the long side L3 of the third deflector 140 and the long side L4 of the adjacent fourth deflector 150 at other ends thereof located farther away from the inflow side 111. Therefore, the third deflectors 140 and the fourth deflector 150 adjacent to each other can guide air from the inflow side 111 towards the outflow side 112 to flow towards the downstream side of the second heat pipe 300 and then leave from of the outflow side 112. Accordingly, the third deflectors 140 and the fourth deflector 150 adjacent to each other can guide air to flow towards the outflow side 112, and the air can cool the heat source (e.g., a CPU, a resistor and a capacitor) located adjacent to the outflow side 112.

In this and other embodiments, the maximum distance D5 between the long side L1 of the first deflector 120 and the long side L2 of the second deflector 130 adjacent to each other is smaller than the maximum distance D7 between the long side L3 of the third deflectors 140 and the long side L4 of the fourth deflector 150 adjacent to each other. Furthermore, the minimum distance D6 between the long side L1 of the first deflector 120 and the long side L2 of the second deflector 130 adjacent to each other is smaller than the minimum distance D8 between the long side L3 of the third deflector 140 and the long side L4 of the fourth deflector 150 adjacent to each other. Accordingly, the heat dissipation performance of the heat dissipation device 10 can be improved by the airflow path formed by the first deflectors 120, the second deflectors 130, the third deflectors 140 and the fourth deflectors 150.

In this and other embodiments, the main body 110 may further have two fifth communication openings O5, and each of the fins 100 may further include two fifth deflectors 160. Since the two fifth communication openings O5 are arranged reflection symmetry with respect to the two first deflectors 120, and the two fifth deflectors 160 are arranged reflection symmetry with respect to the two first deflectors 120, only one of the fifth communication openings O5 and only one of the fifth deflectors 160 are described below.

The fifth communication opening O5 is connected to the passage S, and the second communication opening O2 is located between the fifth communication opening O5 and the adjacent first communication opening O1. The fifth deflector 160 is arranged obliquely relative to the main body 110 and located on one side of the fifth communication opening O5 located relatively close to the second deflector 130, and air flowing out of the fifth communication opening O5 is guided by the fifth deflector 160 to flow towards one side of the fifth deflector 160 located relatively far away from the second deflector 130. That is, air flowing out of the fifth communication opening O5 can directly cool the heat source (e.g., a CPU, a resistor and a capacitor) located adjacent to the outflow side 112. Furthermore, a long side L5 of the fifth deflector 160 is substantially parallel to the long side L2 of the second deflector 130.

In this and other embodiments, the heat dissipation device 10 may further include two third heat pipes 400. Each of the third heat pipes 400 is located between one fifth deflector 160 and one second deflector 130 adjacent to each other, and air flowing out of the second communication openings O2 is guided by the second deflectors 130 to flow towards the third heat pipes 400. Furthermore, air flowing from the inflow side 111 towards the outflow side 112 is guided by the fifth deflectors 160 to flow towards the third heat pipes 400 so as to cool the third heat pipes 400, and then, cool the heat source (e.g., a CPU, a resistor and a capacitor) located adjacent to the outflow side 112.

In this and other embodiments, diameters of at least two of the first heat pipe 200, the second heat pipes 300 and the third heat pipes 400 are different from each other. For example, a diameter D9 of the first heat pipe 200 and a diameter D9 of one of the second heat pipes 300 are larger than diameters D10 of the other heat pipes, but the present disclosure is not limited thereto. In other embodiments, diameters of the first heat pipe, the second heat pipes and the third heat pipes may be the same or different from one another.

An airflow direction F (as shown in FIG. 4) is defined to be substantially perpendicular to the inflow side 111 and pointing from the inflow side 111 towards the outflow side 112. As shown in FIG. 2, in this and other embodiments, acute angles θ1-θ5 are formed between the airflow direction F and the long sides L1 of the first deflectors 120, the long sides L2 of the second deflectors 130, the long sides L3 of the third deflectors 140, the long sides L4 of the fourth deflectors 150 and the long sides L5 of the fifth deflectors 160, and the angles θ1-θ5 are the same, but the present disclosure is not limited thereto. In other embodiments, at least some of acute angles formed between the airflow direction and each of the long sides of the first deflectors, the long sides of the second deflectors, the long sides of the third deflectors, the long sides of the fourth deflectors and the long sides of the fifth deflectors L5 may be different from one another.

As shown in FIG. 3, in this and other embodiments, an acute angle θ6 is formed between the main body 110 and each of the first deflectors 120, the second deflectors 130, the third deflectors 140, the fourth deflectors 150 and the fifth deflectors 160, such that air can be guided to flow more smoothly towards the heat pipes and other heat sources, thereby increasing the heat dissipation efficiency of the heat dissipation device 10.

In this and other embodiments, an airflow generator 500 (e.g., an axial flow fan) is disposed on the heat dissipation device 10. The inflow side 111 and the outflow side 112 of the main body 110 are respectively located adjacent to the airflow generator 500 and a graphics card body. Accordingly, airflow generated by the airflow generator 500 may flow from the inflow side 111 of the main body 110 towards the outflow side 112 of the main body 110. In detail, as shown in FIG. 4, descriptions of airflow path between the two first deflectors 120 and between the two third deflectors 140 are given below. The airflow generated by the airflow generator 500 flows into the passage S, then flows out of the first communication openings O1 and towards the first heat pipe 200 in directions F1, and flows out of the third communication openings O3 and into the area between the two third deflectors 140 in directions F3. Then, airflow between the two first deflectors 120 and airflow between the two third deflectors 140 flow towards the heat source and electronic components around the heat source located adjacent to the outflow side 112.

Then, descriptions of airflow path between the first deflector 120 and the second deflector 130 adjacent to each other and between the third deflector 140 and the fourth deflector 150 adjacent to each other are given below. Airflow generated by the airflow generator 500 flows into the passage S, and then, is guided by the second deflector 130 and the first deflector 120 to flow towards the second heat pipe 300 in directions F2. Then, airflow between the first deflector 120 and the second deflector 130 flow towards the outflow side 112 and guided by the third deflector 140 and the fourth deflector 150 to flows towards the heat source and the electronic components around the heat source located adjacent to the outflow side 112 in directions F4.

Then, descriptions of airflow path between the second deflector 130 and the fifth deflector 160 adjacent to each other are given below. Airflow generated by the airflow generator 500 flows into the passage S, then flows out of the second communication openings O2 and towards the third heat pipes 400 in directions F5, and is guided by the fifth deflectors 160 to flow towards the third heat pipes 400 in directions F6. Then, airflow between the second deflector 130 and the fifth deflector 160 adjacent to each other flows towards the heat source and electronic components around the heat source located adjacent to the outflow side 112.

Then, descriptions of spaces outside of the fifth deflectors 160 are given below. Airflow generated by the airflow generator 500 flows into the passage S, then flows out of the fifth communication openings O5 and towards outside of the heat dissipation device 10 in directions F7. That is, a part of the airflow generated by the airflow generator 500 flows towards the electronic components around the outflow side 112.

Therefore, in this embodiment, the heat dissipation device 10 not only can cool the heat pipes having higher temperature, but also can meet the heat dissipation requirements of the heat source and the electronic components around the heat source located adjacent to the outflow side 112.

In this embodiment, the quantity of the first heat pipe 200 is single one, the quantity of the second heat pipes 300 is two, and the quantity of the third heat pipes 400 is two, but the present disclosure is not limited thereto. In other embodiments, the quantity of the first heat pipe may be two or more. Similarly, the quantity of the second heat pipe and the quantity of the third heat pipe may be single one or three or more.

In this embodiment, the quantity of the first deflectors 120, the quantity of the second deflectors 130, the quantity of the third deflectors 140, the quantity of the fourth deflectors 150 and the quantity of the fifth deflectors 160 are two and arranged in reflection symmetry with respect to the first heat pipe 200 as a center, but the present disclosure is not limited thereto. In other embodiments, the quantity of the second deflector, the quantity of the fourth deflector and the quantity of the fifth deflector may be single one, and the second deflector, the fourth deflector and the fifth deflector may be all located at the same side of the first heat pipe (i.e., they are arranged one-sided).

In the above embodiment, each of the fins 100 has two first deflectors 120 and two second deflectors 130, but the present disclosure is not limited thereto. In other embodiments, each fin may have only one first deflector and only one second deflector. In detail, a heat dissipation device includes a plurality of fins, a first heat pipe and a second heat pipe. Each of the fins includes a main body, a first deflector and a second deflector. Each of the main bodies has an inflow side, an outflow side, a first communication opening and a second communication opening. The first communication opening and the second communication opening are located between the inflow side and the outflow side. The first deflector and the second deflector are arranged obliquely relative to the main body and respectively located on one side of the first communication opening and one side of the second communication opening, air flowing out of the first communication opening is guided by the first deflector to flow towards one side of the first deflector located relatively far away from the second deflector, and air flowing out of the second communication opening is guided by the second deflector to flow towards one side of the second deflector located relatively far away from the first deflector. The first heat pipe is located on one side of the first deflector located farther away from the second deflector. The second heat pipe is located between the first deflector and the second deflector.

The heat dissipation device 10 described above may be disposed on a heat source, such as a CPU and a GPU, so as to cool it. Descriptions of the heat dissipation device 10 disposed on a GPU are given below. A graphics card assembly includes a graphics card body and a heat dissipation device. The heat dissipation device is disposed on the graphics card body. The heat dissipation device includes a plurality of fins, a first heat pipe and a second heat pipe. Each of the fins includes a main body, a first deflector and a second deflector. Each of the main bodies has an inflow side, an outflow side, a first communication opening and a second communication opening. The first communication opening and the second communication opening are located between the inflow side and the outflow side. The first deflector and the second deflector are arranged obliquely relative to the main body and respectively located on one side of the first communication opening and one side of the second communication opening, air flowing out of the first communication opening is guided by the first deflector to flow towards one side of the first deflector located relatively far away from the second deflector, and air flowing out of the second communication opening is guided by the second deflector to flow towards one side of the second deflector located relatively far away from the first deflector. The first heat pipe is located on one side of the first deflector located farther away from the second deflector. The second heat pipe is located between the first deflector and the second deflector.

According to the heat dissipation device and the graphics card assembly as described above, by the design of the first deflector and the second deflector, airflow may be directly guided by the communication opening and the deflector to flow directly towards the heat pipes, or only guided by the deflector to flow towards the heat pipes. Accordingly, the heat dissipation device not only can cool the heat pipes having higher temperature, but also can meet the heat dissipation requirements of the heat source and the electronic components around the heat source located adjacent to the outflow side.

Furthermore, since the maximum distance between the long sides of the two first deflectors is larger than the maximum distance between the long sides of the two third deflectors, and the minimum distance between the long sides of the two first deflectors is larger than the minimum distance between the long sides of the two third deflectors, the heat dissipation performance of the heat dissipation device can be improved by the airflow path formed by the two first deflectors and the two third deflectors.

Furthermore, since the maximum distance between the long side of the first deflector and the long side of the second deflector located adjacent to each other is smaller than the maximum distance between the long side of the third deflector and the long side of the fourth deflector located adjacent to each other, and the minimum distance between the long side of the first deflectors and the long side of the second deflector located adjacent to each other is smaller than the minimum distance between the long side of the third deflector and the long side of the fourth deflector adjacent to each other, the heat dissipation performance of the heat dissipation device can be improved by the airflow path formed by the first deflectors, the second deflectors, the third deflectors and the fourth deflectors.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A heat dissipation device comprising:
   a plurality of fins each comprising a main body and two first deflectors, wherein the main body has an inflow side, an outflow side and two first communication openings located between the inflow side and the outflow side, the two first deflectors are arranged obliquely relative to the main body and respectively located on sides of the two first communication openings, and air flowing out of the two first communication openings is guided by the two first deflectors to flow into an area between the two first deflectors;
   at least one first heat pipe located between the two first deflectors; and
   at least one second heat pipe located on one side of one of the two first deflectors located relatively far away from the other one of the two first deflectors;
   wherein each of the plurality of fins further comprises at least one second deflector, the main body further has at least one second communication opening located on one side of one of the two first deflectors located relatively far away from the other one of the two first deflectors, the at least one second deflector is arranged obliquely relative to the main body and located on one side of the at least one second communication opening located relatively close to the two first deflectors, and air flowing out of the at least one second communication opening is guided by the at least one second deflector to flow towards one side of the at least one second deflector located relatively far away from the two first deflectors; and
   wherein a distance between a long side of the at least one second deflector and a long side of one of the first deflectors gradually decreases in a direction from the inflow side towards the outflow side.

2. The heat dissipation device according to claim 1, wherein an airflow direction is defined to be substantially perpendicular to the inflow side and pointing from the inflow side towards the outflow side, and an acute angle is formed between the airflow direction and a long side of each of the first deflectors.

3. The heat dissipation device according to claim 1, wherein a distance between long sides of the two first deflectors gradually increases in the direction from the inflow side towards the outflow side.

4. The heat dissipation device according to claim 1, wherein an airflow direction is defined to be substantially perpendicular to the inflow side and pointing from the inflow side towards the outflow side, and an acute angle is formed between the airflow direction and the long side of the at least one second deflector.

5. The heat dissipation device according to claim 1, wherein each of the plurality of fins further comprises two third deflectors, the main body further has two third communication openings located between the inflow side and the outflow side, the two third communication openings are located farther away from the inflow side than the two first communication openings to the inflow side, the two third deflectors are arranged obliquely relative to the main body and respectively located on sides of the two third communication openings, and air flowing out of the two third communication openings is guided by the two third deflectors to flow into an area between the two third deflectors.

6. The heat dissipation device according to claim 5, wherein an airflow direction is defined to be substantially perpendicular to the inflow side and pointing from the inflow side towards the outflow side, and an acute angle is formed between the airflow direction and a long side of each of the third deflectors.

7. The heat dissipation device according to claim 5, wherein a distance between long sides of the two third deflectors gradually increases in the direction from the inflow side towards the outflow side.

8. The heat dissipation device according to claim 7, wherein a maximum distance between long sides of the two first deflectors is larger than a maximum distance between the long sides of the two third deflectors.

9. The heat dissipation device according to claim 7, wherein a minimum distance between long sides of the two first deflectors is larger than a minimum distance between the long sides of the two third deflectors.

10. The heat dissipation device according to claim 5, wherein each of the plurality of fins further comprises at least one fourth deflector, the main body further has at least one fourth communication opening, the at least one fourth communication opening is located farther away from the inflow side than the at least one second communication opening to the inflow side, the at least one fourth deflector is arranged obliquely relative to the main body and located on one side of the at least one fourth communication opening located relatively close to the two third deflectors, and air flowing out of the at least one fourth communication opening is guided by the at least one fourth deflector to flow towards one side of the at least one fourth deflector located relatively far away from the two third deflectors.

11. The heat dissipation device according to claim 10, wherein an airflow direction is defined to be substantially perpendicular to the inflow side and pointing from the inflow side towards the outflow side, and an acute angle is formed between the airflow direction and a long side of the at least one fourth deflector.

12. The heat dissipation device according to claim 10, wherein a distance between a long side of the at least one fourth deflector and a long side of one of the two third deflectors located closer to the at least one fourth deflector gradually decreases in the direction from the inflow side towards the outflow side.

13. The heat dissipation device according to claim 10, wherein each of the plurality of fins further comprises at least one fifth deflector, the main body further has at least one fifth communication opening, the at least one second communication opening is located between the at least one fifth communication opening and one of the first communication openings located closer to the at least one fifth communication opening, the at least one fifth deflector is arranged obliquely relative to the main body and located on one side of the at least one fifth communication opening located relatively close to the at least one second deflector, and air flowing out of the at least one fifth communication opening is guided by the at least one fifth deflector to flow towards one side of the at least one fifth deflector located relatively far away from the at least one second deflector.

14. The heat dissipation device according to claim 13, wherein a long side of the at least one fifth deflector is substantially parallel to the long side of the at least one second deflector.

15. The heat dissipation device according to claim 13, further comprising at least one third heat pipe located between the at least one second deflector and the at least one fifth deflector.

16. The heat dissipation device according to claim 15, wherein diameters of at least two of the at least one first heat pipe, the at least one second heat pipe and the at least one third heat pipe are different from each other.

17. The heat dissipation device according to claim 1, wherein an acute angle is formed between the main body and each of the first deflectors.

18. A heat dissipation device comprising:
a plurality of fins each comprising a main body, a first deflector and a second deflector, wherein the main body has an inflow side, an outflow side, a first communication opening and a second communication opening, the first communication opening and the second communication opening are located between the inflow side and the outflow side, the first deflector and the second deflector are arranged obliquely relative to the main body, the first deflector is located on one side of the first communication opening, the second deflector is located on one side of the second communication opening, air flowing out of the first communication opening is guided by the first deflector to flow towards one side of the first deflector located away from the second deflector, and air flowing out of the second communication opening is guided by the second deflector to flow towards one side of the second deflector located relatively far away from the first deflector;
at least one first heat pipe located at one side of the first deflector located relatively far away from the second deflector; and
at least one second heat pipe located between the first deflector and the second deflector;
wherein a distance between a long side of the first deflector and a long side of the second deflector gradually decreases in a direction from the inflow side towards the outflow side.

19. The heat dissipation device according to claim 18, wherein each of the plurality of fins further comprises a third deflector, the main body further has a third communication opening located between the inflow side and the outflow side, the third communication opening is located farther away from the inflow side than the first communication opening to the inflow side, the third deflector is arranged obliquely relative to the main body and located on one side of the third communication opening, and an outflow direction from the third communication opening is same as an outflow direction from the first communication opening.

20. The heat dissipation device according to claim 19, wherein an airflow direction is defined to be substantially perpendicular to the inflow side and pointing from the inflow side towards the outflow side, and an acute angle is formed between the airflow direction and a long side of the third deflector.

21. The heat dissipation device according to claim 19, wherein each of the plurality of fins further comprises a fourth deflector, the main body further has a fourth communication opening, the fourth communication opening is located farther away from the inflow side than the second communication opening to the inflow side, the fourth deflector is arranged obliquely relative to the main body and located on one side of the fourth communication opening located relatively close to the third deflector, and air flowing out of the fourth communication opening is guided by the fourth deflector to flow towards one side of the fourth deflector located farther away from the third deflector.

22. The heat dissipation device according to claim 21, wherein an airflow direction is defined to be substantially perpendicular to the inflow side and pointing from the inflow side towards the outflow side, and an acute angle is formed between the airflow direction and a long side of the fourth deflector.

23. The heat dissipation device according to claim 21, wherein a distance between a long side of the fourth deflector and a long side of the third deflector gradually decreases in the direction from the inflow side towards the outflow side.

24. The heat dissipation device according to claim 23, wherein a maximum distance between the long side of the first deflector and the long side of the second deflector is smaller than a maximum distance between the long side of the third deflector and the long side of the fourth deflector.

25. The heat dissipation device according to claim 23, wherein a minimum distance between the long side of the first deflector and the long side of the second deflector is smaller than a minimum distance between the long side of the third deflector and the long side of the fourth deflector.

26. The heat dissipation device according to claim 21, wherein each of the plurality of fins further comprises a fifth deflector, the main body further has a fifth communication opening, the second communication opening is located between the fifth communication opening and the first communication opening, the fifth deflector is arranged obliquely relative to the main body and located on one side of the fifth communication opening located closer to the second deflector, and air flowing out of the fifth communication opening is guided by the fifth deflector to flow towards one side of the fifth deflector located farther away from the second deflector.

27. The heat dissipation device according to claim 26, wherein a long side of the fifth deflector is substantially parallel to the long side of the second deflector.

28. The heat dissipation device according to claim 26, further comprising at least one third heat pipe located between the second deflector and the fifth deflector.

29. The heat dissipation device according to claim 28, wherein diameters of at least two of the at least one first heat pipe, the at least one second heat pipe and the at least one third heat pipe are different from each other.

30. The heat dissipation device according to claim 18, wherein an acute angle is formed between the first deflector and the main body, and an acute angle is formed between the second deflector and the main body.

31. A graphics card assembly comprising:
a graphics card body; and
a heat dissipation device disposed on the graphics card body, and the heat dissipation device comprising:
a plurality of fins each comprising a main body, a first deflector and a second deflector, wherein the main body has an inflow side, an outflow side, a first communication opening and a second communication opening, the first communication opening and the second communication opening are located between the inflow side and the outflow side, the first deflector and the second deflector are arranged obliquely relative to the main body, the first deflector is located on one side of the first communication opening, the second deflector is located on one side of the second communication opening, air flowing out of the first communication opening is guided by the first deflector to flow towards one side of the first deflector located relatively far away from the second deflector, and air flowing out of the second communication opening is guided by the second deflector to flow towards one side of the second deflector located relatively far away from the first deflector;
at least one first heat pipe located on one side of the first deflector located relatively far away from the second deflector; and
at least one second heat pipe located between the first deflector and the second deflector;
wherein a distance between a long side of the first deflector and a long side of the second deflector gradually decreases in a direction from the inflow side towards the outflow side.

32. The graphics card assembly according to claim 31, further comprising an airflow generator disposed on the heat dissipation device, wherein the inflow side and the outflow side of the main body are respectively located adjacent to the airflow generator and the graphics card body.

* * * * *